(12) United States Patent
Chiang

(10) Patent No.: US 8,847,081 B2
(45) Date of Patent: Sep. 30, 2014

(54) PLANAR THERMAL DISSIPATION PATCH

(71) Applicant: Kuo-Ching Chiang, New Taipei (TW)

(72) Inventor: Kuo-Ching Chiang, New Taipei (TW)

( * ) Notice: Subject to any disclaimer, the term of this patent is extended or adjusted under 35 U.S.C. 154(b) by 67 days.

(21) Appl. No.: 13/736,130

(22) Filed: Jan. 8, 2013

(65) Prior Publication Data
US 2013/0126146 A1    May 23, 2013

Related U.S. Application Data

(63) Continuation-in-part of application No. 12/132,277, filed on Jun. 3, 2008, now abandoned.

(51) Int. Cl.
| | |
|---|---|
| *H05K 1/16* | (2006.01) |
| *F28F 3/00* | (2006.01) |
| *H05K 1/09* | (2006.01) |
| *B82Y 10/00* | (2011.01) |
| *B82Y 30/00* | (2011.01) |

(52) U.S. Cl.
CPC . *F28F 3/00* (2013.01); *B82Y 10/00* (2013.01); H05K 2201/0326 (2013.01); H05K 2201/0209 (2013.01); *H05K 1/09* (2013.01); H05K 2201/0329 (2013.01); H05K 2201/0323 (2013.01); *H05K 1/092* (2013.01); *H05K 1/095* (2013.01); H05K 2201/026 (2013.01); *B82Y 30/00* (2013.01); H05K 2201/0108 (2013.01)
USPC .......................................... 174/260; 174/252

(58) Field of Classification Search
CPC ........... B82Y 10/00; B82Y 30/00; F28F 3/00; H05K 1/09; H05K 1/092; H05K 1/095; H05K 2201/0108; H05K 2201/0209; H05K 2201/026; H05K 2201/0323; H05K 2201/0326; H05K 2201/0329
USPC .......... 174/250, 252, 254, 256–260; 977/742, 977/750, 752; 257/930, E23.082
See application file for complete search history.

(56) References Cited

U.S. PATENT DOCUMENTS

| | | | | |
|---|---|---|---|---|
| 4,782,893 | A  * | 11/1988 | Thomas ......................... | 165/185 |
| 2002/0023733 | A1* | 2/2002 | Hall et al. .................... | 165/80.3 |
| 2005/0230082 | A1* | 10/2005 | Chen ............................ | 165/80.3 |
| 2007/0281122 | A1* | 12/2007 | Blanchard et al. ............. | 428/63 |
| 2011/0156587 | A1* | 6/2011 | Wu ................................ | 315/35 |

* cited by examiner

*Primary Examiner* — Yuriy Semenenko
(74) *Attorney, Agent, or Firm* — Chih Feng Yeh; Huntington IP Consulting Co., Ltd.

(57) ABSTRACT

A planar thermal dissipation patch comprises a polymer substrate; an adhesive layer attached under the polymer substrate; a protection sheet over the adhesive layer, the protection sheet is removed from the adhesive layer before attaching the planar thermal dissipation patch; a thermal dissipation layer formed on the polymer substrate; wherein the thermal dissipation layer is formed of CNT, conductive polymer, graphite or the combination thereof.

12 Claims, 2 Drawing Sheets

PLANAR THERMAL DISSIPATION PATCH

CROSS-REFERENCE TO RELATED APPLICATION

This application is a continuation-in-part of application Ser. No. 12/132,277, filed Jun. 3, 2008.

TECHNICAL FIELD

The present invention relates to a thermal dissipation device, and more particularly, to a planar thermal dissipation patch.

DESCRIPTION OF THE RELATED ARTS

Recently, multilayer print circuit boards (PCB) used for various kinds of electronic products have been developed as the technology of high density electric circuit construction is advanced. An example of the multilayer print circuit boards includes an inner print circuit pattern provided on a surface of a substrate overlaid by an insulation layer on which an outer print circuit pattern is further provided, and the inner and outer circuit patterns are electrically connected to each other through a blind hole in the insulation layer. Electro-less plating resist layer is formed on a surface of the cured bond layer by screen-printing an ink pattern as a plating resist, it is cured by heat. Blind hole for electrically connecting inner and outer circuit patterns is formed by using a carbonic acid gas laser, and a through hole adjacent to the blind hole by drilling. An outer circuit pattern is formed on the insulation layer by the electro-less plating. A semiconductor device or chip is typically formed over the PCB. As known in the art, the thermal is generated from the device. The conventional method to dissipate the thermal is to employ thermal sink having fins. However, it is incompatible to the tablet computer (pad) or smart phone due to the structure is too think and irregular.

SUMMARY

An object of the present invention is to provide advanced thermal dissipation patch without the drawbacks mentioned above.

A planar thermal dissipation patch comprises a polymer substrate; an adhesive layer attached under said polymer substrate, to allow a user to attach said planar thermal dissipation film on a surface of an electronic device where thermal is generated; a protection sheet over said adhesive layer, said protection sheet being removing from said adhesive layer before attaching said planar thermal dissipation film; a thermal dissipation layer formed on said polymer substrate; wherein said thermal dissipation layer is formed of CNT (carbon nanotube), conductive polymer, graphite or the combination thereof. The polymer substrate is flexible to allow said user to attach said planar thermal dissipation film on surface of the device. The planar thermal dissipation patch is deformed or cut-out by said user to fit said surface. The conductive polymer includes polythiophenes, poly(selenophenes), poly(tellurophenes), polypyrroles, polyanilines. The electronic device is connected to at least one circuit pattern of PCB, wherein said at least one circuit pattern is formed of CNT, conductive polymer, graphite or the combination thereof.

DETAILED DESCRIPTION

Figure 1:
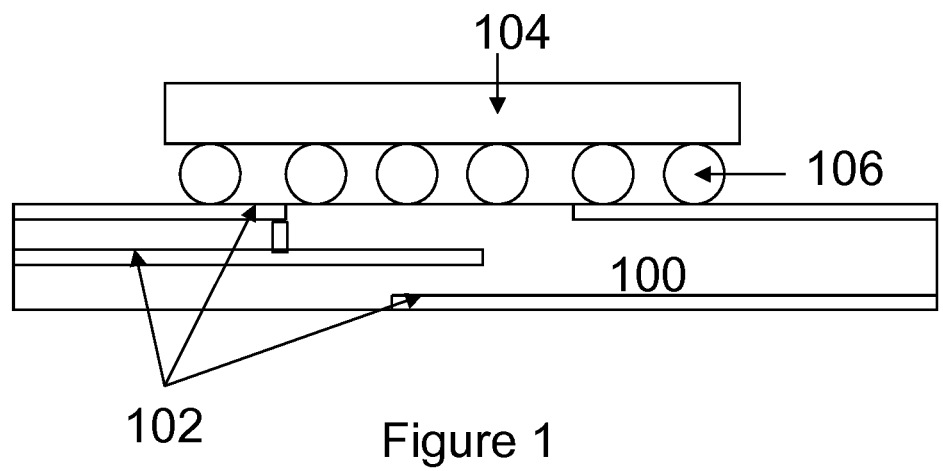
FIG. 1 is a sectional view showing a print circuit board of the present invention.

FIG. 1 is a sectional view of a print circuit board of the present invention. As shown in FIG. 1, in the single (or multi) layer print circuit board 100 of the present invention, The PCB 100 includes an insulation substrate having a flat shape is used as a support base. The insulation substrate is made of epoxy resin or glass fiber enhanced epoxy resin. At least one circuit pattern 102 is provided on one of the upper surface or the bottom surface of the insulation substrate. The circuits may be formed within the PCB 100. The prior art includes conductive layer made of copper foils laminated on both the upper surface and the bottom surface of the insulation substrate. After dry films are exposed to an ultraviolet ray through a photomask and are developed by using a water solution of 1% sodium carbonate, they are etched by using a water solution of cupric chloride. The dry films are removed, resulting in the inner circuit pattern. The present invention do not use the conventional method due to it raises drawbacks. An electronic component or device 104 may be formed on the PCB 100 via electronic connection 106. Some of the connections 106 are coupled to the desired circuit pattern 102. The device 104 is illustrated for example only, not to limit the present invention. It should be note that any kind of device can be formed on the PCB. The shape of the connection 106 can be bump, pin and so on.

A planar thermal dissipation patch comprises a polymer substrate; an adhesive layer attached under the polymer substrate; a protection sheet covered the adhesive layer, the protection sheet is removed from the adhesive layer before attaching the planar thermal dissipation patch; a thermal dissipation layer formed on the polymer substrate; wherein the thermal dissipation layer is formed of CNT, conductive polymer, graphite or the combination thereof. The polymer substrate is flexible to allow the user to attach the planar thermal dissipation film on surface of the device. The planar thermal dissipation film is deformed or cut-out by the user to fit the surface. The conductive polymer includes polythiophenes, poly(selenophenes), poly(tellurophenes), polypyrroles, polyanilines. The electronic device is connected to at least one circuit pattern of PCB, wherein the at least one circuit pattern is formed of CNT, conductive polymer, graphite or the combination thereof.

Figure 3:
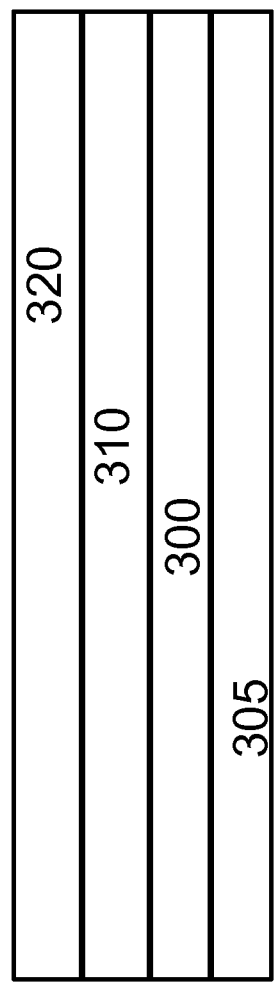
FIG. 3 is a planar thermal dissipation patch of the present invention.

Please refer to FIG. 3, in order fit the tablet or smartphone dissipation, a planar thermal dissipation film is disclosed. It includes a polymer substrate 310, an adhesive material 300 is attached under the polymer substrate 310, preferably, the polymer substrate 310 is conductive polymer substrate 310 to allow the user to attach the planar thermal dissipation film on anywhere the thermal is generated. A protection sheet 305 is covered the adhesive layer, the protection sheet is removed from the adhesive layer before attaching the planar thermal dissipation patch A thermal dissipation layer 320 is formed on the polymer substrate 310. The polymer substrate 310 is flexible to allow the user to attach the planar thermal dissipation film on the non-planar surface of the device. The thermal dissipation layer 320 is formed with material, such as CNT, conductive polymer, or graphite. Alternatively, the graphene can be used for the thermal dissipation layer 320. The carbon-carbon bond length in graphene is about 0.142 nanometers. Graphene sheets stack to form graphite with an interplanar spacing of 0.335 nm. Graphene is the basic structural element of some carbon allotropes. It can also be considered as an indefinitely large aromatic molecule, the limiting case of the family of flat polycyclic aromatic hydrocarbons. The method of forming the material includes mechanical exfoliation, epitaxial growth on silicon carbide, epitaxial growth on metal substrates, reduction of graphhene oxide. The polymer material maybe In one embodiment, the material for the conductive pattern 102 includes oxide containing metal or alloy, wherein the metal is preferable to select one or more metals from Au, Zn, Ag, Pd, Pt, Rh, Ru, Cu, Fe, Ni, Co, Sn, Ti, In, Al, Ta, Ga, Ge and Sb. Some of the transparent material includes oxide containing Zn with Al2O3 doped therein. This shape is constructed by using an adequate mask during the forming process of the transparent conducting layer. The material can be used for the above thermal dissipation layer as well.

The method for forming the transparent conductive layer includes ion beam method for film formation at low temperature, for example, the film can be formed with receptivity lower than 3×10−4 Ω·cm at room temperature. Further, the RF magnetron sputtered thin film method could also be used. The transparent can be higher than 82%. Under the cost and production consideration, the method for forming the film, for example, indium tin oxide, could be formed at room temperature in wet atmosphere has an amorphous state, a desired pattern can be obtained at a high etching rate. After the film is formed and patterned, it is thermally treated at a temperature of about between 180 degree C. and 220 degree C. for about one hour to three hours to lower the film resistance and enhance its transmittance. Another formation is chemical solution coating method. The coating solution includes particles having an average particle diameter of 1 to 25 μm, silica particles having an average particle diameter of 1 to 25 μm, and a solvent. The weight ratio of the silica particles to the conductive particles is preferably in the range of 0.1 to 1. The conductive particles are preferably metallic particles of one or more metals selected from Au, Zn, Ag, Pd, Pt, Rh, Ru, Cu, Fe, Ni, Co, Sn, Ti, In, Al, Ta, Ga, Ge and Sb. The conductive particles can be obtained by reducing a salt of one or more kinds of the aforesaid metals in an alcohol/water mixed solvent. Heat treatment is performed at a temperature of higher than about 100 degree C. The silica particles may improve the conductivity of the resulting conductive film. The metallic particles are approximately contained in amounts of 0.1 to 5% by weight in the conductive film coating liquid.

The transparent conductive film can be formed by applying the liquid on a substrate, drying it to form a transparent conductive particle layer, then applying the coating liquid for forming a transparent film onto the fine particle layer to form a transparent film on the particle layer. The coating liquid for forming a transparent conductive layer is applied onto a substrate by a method of dipping, spinning, spraying, roll coating, flexographic printing or the like and then drying the liquid at a temperature of room temperature to about 90.degree. C. After drying, the coating film is curing by heated at a temperature of not lower than 100 degree C. or irradiated with an electromagnetic wave or in the gas atmosphere.

Alternatively, the material for forming aforementioned circuits pattern or thermal dissipation layer 320 includes conductive polymer, conductive carbon or conductive glue. The non-metal material is lighter weight, cost reduction, eliminates the environment issue and benefits simple process. The conventional PCB is formed of copper or the like. The cost of the copper is high and it is heavy. On the contrary, the present invention employs the non-metallic material to act the circuits pattern for PCB to save the cost and lose weight. The formation of the conductive polymer, conductive carbon or conductive glue may be shaped or formed by printing (such as screen printing), coating, attaching by adhesion or etching. The process is simplified than the conventional one. On the other hand, the thin film can be attached or formed on irregular surface or non planar surface.

In one embodiment, the material can be formed by conductive polymer, conductive glue or conductive carbon (such as carbon nano-tube; CNT). In one embodiment, the conductive pattern and the blind hole is formed of nano-scale conductive carbon, such as carbon nanotubes (CNTs) that comprises multiple concentric shells and termed multi-walled carbon nanotubes (MWNTs), single-walled carbon nanotubes (SWNTs) that includes a single graphene rolled up on itself, it were synthesized in an arc-discharge process using carbon electrodes doped with transition metals. The seamless graphitic structure of single-walled carbon nanotubes (SWNTs) endows these materials with exceptional mechanical properties: Young's modulus in the low TPa range and tensile strengths in excess of 37 GPa, please refer to the Articles: Yakobson et al., Phys. Rev. Lett. 1996, 76, 2411; Lourie et al., J. Mater. Res. 1998, 13, 2418; Iijima et al., J. Chem. Phys. 1996, 104, 2089. Generally, CNT composites interpenetrating nanofiber networks, the networks comprising mutually entangled carbon nanotubes intertwined with macromolecules in a cross-linked polymer matrix. On of the method to form the CNT is the infusion of organic molecules capable of penetrating into the clumps of tangled CNTs, thereby causing the nanotube networks to expand and resulting in exfoliation. Subsequent in situ polymerization and curing of the organic molecules generates interpenetrating networks of entangled CNTs or CNT nanofibers (ropes), intertwined with cross-linked macromolecules.

The conductive polymer includes polythiophenes, poly(selenophenes), poly(tellurophenes), polypyrroles, polyanilines. In one embodiment, the conductive polymer maybe made from at least one precursor monomer selected from thiophenes, selenophenes, tellurophenes, pyrroles, anilines, and polycyclic aromatics. The polymers made from these monomers are referred to herein as polythiophenes, poly(selenophenes), poly(tellurophenes), polypyrroles, polyanilines, and polycyclic aromatic polymers, respectively. U.S. Patent Application 20080017852 to Huh; Dal Ho et al., entitled "Conductive Polymer Composition Comprising Organic Ionic Salt and Optoelectronic Device Using the Same", it discloses a method of forming conductive polymer. In one embodiment, the conductive polymer is an organic polymer semiconductor, or an organic semiconductor. The conductive polyacetylenes type include polyacetylene itself as well as polypyrrole, polyaniline, and their derivatives. Conductive organic polymers often have extended delocalized bonds, these create a band structure similar to silicon, but with localized states. The zero-band gap conductive polymers may behave like metals. Alternatively, the circuits pattern of PCB can be formed of conductive glue that can be made of material such as silicon glue or epoxy, etc. The thin film antenna is transparent. In one embodiment, the conductive glue may be formed of the mixture of at least one glass, additive and conductive particles (such as metallic particles). The conductive glue maybe includes aluminum (and/or silver) powder and a curing agent. The glass is selected from Al2O3、B2O3、SiO2、Fe2O3、P2O5、TiO2、B2O3/H3BO3/Na2B4O7、PbO、MgO、Ga2O3、Li2O、V2O5、ZnO2、Na2O、ZrO2、TlO/Tl2O3/TlOH、NiO/Ni、MnO2、CuO、AgO、Sc2O3、SrO、BaO、CaO、Tl、ZnO. The additive material includes oleic acid.

Figure 2:
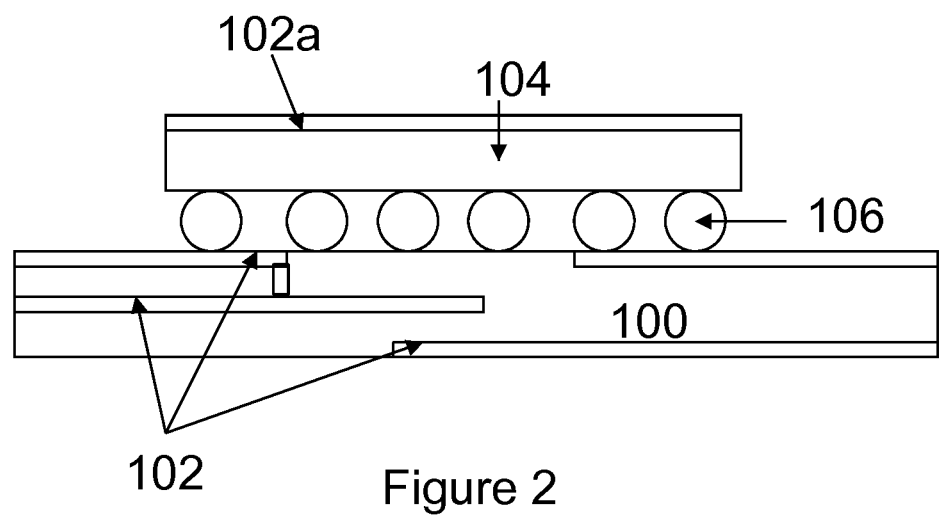
FIG. 2 is a sectional view showing a print circuit board of the present invention.

Alternatively, the connection 106 of electronic device 104 maybe formed of above material to avoid the environment issue. The material has no lead contained therein. Therefore, the lead-free structure can be provided. Further, the aforementioned conductive material 102a for circuit pattern can be formed on at least one surface of the device 104, for example upper surface, side surface, lower surface to enhance the thermal dissipation as shown in FIG. 2. In the FIG. 2, the electronic device 104 is made by flip-chip scheme which is known in the art. The substrate of the electronic device 104 is the upper surface which contacts with the aforementioned conductive material 102a when the device 104 is mounted on the circuit board. Thus, the device's substrate (upper surface of the electronic device 104) includes the nano-scale conductive material formed thereon to increase the effective surface to enhance the thermal dissipation. The device's substrate includes silicon, metal, alloy, ceramic, glass or isolation as known in the art. Any type of the package can be used to achieve the purpose of the present invention. If the upper surface (device's substrate) of the device 104 is coated with the conductive material 102a having nano-scale dimension, such as the aforementioned CNT, conductive polymer, glue and ITO. The nano-scale material may have more effective surface area than larger scale material to effectively increase the thermal dissipation surface. Further, as mentioned in the abstract of the present invention, the present invention provides a multilayer print circuit board having at least two circuit patterns laminated on a circuit board substrate through an insulation layer and being electrically connected to each other through a blind hole 102b provided in the insulation layer to form an electrical connection. At least one circuit pattern is formed of non-metal material for electrically connection between the conductive layers and the blind hole 102b. If the blind hole is refilled with the polymer, CNT or the ITO, it may easily refilled into the hole to form the electrical connection with air gap or cavity free in the plug due to these materials have the character of flowability above before curing even the dimension is narrowed.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure. While the preferred embodiment of the invention has been illustrated and described, it will be appreciated that various changes can be made therein without departing from the spirit and scope of the invention.

What is claimed is:

1. A planar thermal dissipation patch comprising: a polymer substrate; an adhesive layer attached under said polymer substrate, to allow a user to attach said planar thermal dissipation patch on a surface of an electronic device where thermal is generated; a protection sheet covered said adhesive layer, said protection sheet being removing from said adhesive layer before attaching said planar thermal dissipation patch; a thermal dissipation layer formed on said polymer substrate; wherein said thermal dissipation layer is formed of carbon nanotube (CNT), conductive polymer, graphite or the combination thereof.

2. The planar thermal dissipation patch of claim 1, wherein said polymer substrate is flexible to allow said user to attach said planar thermal dissipation patch on said surface of said electronic device.

3. The planar thermal dissipation patch of claim 1, wherein said planar thermal dissipation patch is deformed or cut-out by said user to fit said surface.

4. The planar thermal dissipation patch of claim 1, wherein said conductive polymer includes polythiophenes, poly(selenophenes), poly(tellurophenes), polypyrroles, or polyanilines.

5. The planar thermal dissipation patch of claim 1, wherein said electronic device is connected to at least one circuit pattern of PCB (print circuit board), wherein said at least one circuit pattern is formed of CNT, conductive polymer, graphite or the combination thereof.

6. A planar thermal dissipation patch comprising: a polymer substrate; an adhesive layer attached under said polymer substrate, to allow a user to attach said planar thermal dissipation patch on a surface of an electronic device where thermal is generated; a protection sheet covered said adhesive layer, said protection sheet being removing from said adhesive layer before attaching said planar thermal dissipation patch; a thermal dissipation layer formed on said polymer substrate; wherein said thermal dissipation layer is formed of carbon nanotube (CNT), conductive polymer, graphite or the combination thereof; wherein said polymer substrate is flexible to allow said user to attach said planar thermal dissipation patch on said surface of said electronic device; said planar thermal dissipation patch being deformed or cut-out by said user to fit said surface.

7. The planar thermal dissipation patch of claim 6, wherein said conductive polymer includes polythiophenes, poly(selenophenes), poly(tellurophenes), polypyrroles, or polyanilines.

8. The planar thermal dissipation patch of claim 6, wherein said electronic device is connected to at least one circuit pattern of PCB (print circuit board), wherein said at least one circuit pattern is formed of CNT, conductive polymer, graphite or the combination thereof.

9. A planar thermal dissipation patch comprising: a polymer substrate; an adhesive layer attached under said polymer substrate, to allow a user to attach said planar thermal dissipation patch on a surface of an electronic device where thermal is generated; a protection sheet covered said adhesive layer, said protection sheet being removing from said adhesive layer before attaching said planar thermal dissipation patch; a thermal dissipation layer formed on said polymer substrate; wherein said thermal dissipation layer is formed of carbon nanotube (CNT), conductive polymer, graphite or the combination thereof; wherein said conductive polymer includes polythiophenes, poly(selenophenes), poly(tellurophenes), polypyrroles, or polyanilines.

10. The planar thermal dissipation patch of claim 9, wherein said polymer substrate is flexible to allow said user to attach said planar thermal dissipation patch on said surface of said electronic device.

11. The planar thermal dissipation patch of claim 9, wherein said planar thermal dissipation patch is deformed or cut-out by said user to fit said surface.

12. The planar thermal dissipation patch of claim 9, wherein said electronic device is connected to at least one circuit pattern of PCB (print circuit board), wherein said at least one circuit pattern is formed of CNT, conductive polymer, graphite or the combination thereof.

* * * * *